United States Patent
Sabathil et al.

(10) Patent No.: US 10,396,260 B2
(45) Date of Patent: Aug. 27, 2019

(54) METHOD OF PRODUCING AN OPTOELECTRONIC COMPONENT AND OPTOELECTRONIC COMPONENT

(71) Applicant: OSRAM Opto Semiconductors GmbH, Regensburg (DE)

(72) Inventors: Matthias Sabathil, Regensburg (DE); Jürgen Moosburger, Lappersdorf (DE); Frank Singer, Regenstauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/574,602

(22) PCT Filed: May 13, 2016

(86) PCT No.: PCT/EP2016/060885
§ 371 (c)(1),
(2) Date: Nov. 16, 2017

(87) PCT Pub. No.: WO2016/184813
PCT Pub. Date: Nov. 24, 2016

(65) Prior Publication Data
US 2018/0151787 A1 May 31, 2018

(30) Foreign Application Priority Data
May 18, 2015 (DE) .......... 10 2015 107 742

(51) Int. Cl.
*H01L 33/62* (2010.01)
*H01L 21/683* (2006.01)
(Continued)

(52) U.S. Cl.
CPC .......... *H01L 33/62* (2013.01); *H01L 21/6835* (2013.01); *H01L 22/22* (2013.01);
(Continued)

(58) Field of Classification Search
CPC ......... H01L 33/62; H01L 33/54; H01L 33/60; H01L 21/6835; H01L 33/0079;
(Continued)

(56) References Cited

U.S. PATENT DOCUMENTS 8,508,038 B2 * 8/2013 Burghartz ........... H01L 21/6835
257/702
8,653,540 B2 * 2/2014 Engl .................... H01L 33/382
257/81
(Continued)

FOREIGN PATENT DOCUMENTS

| DE | 10 2007 030 129 A1 | 1/2009 |
|---|---|---|
| DE | 10 2009 036 621 A1 | 2/2011 |
| DE | 10 2009 051 129 A1 | 6/2011 |
| DE | 10 2010 034 565 A1 | 2/2012 |
| DE | 10 2012 215 524 A1 | 3/2014 |
| DE | 10 2013 107 862 A1 | 1/2015 |

*Primary Examiner* — Bac H Au
(74) *Attorney, Agent, or Firm* — DLA Piper LLP (US)

(57) ABSTRACT

A method of producing an optoelectronic component includes providing a wafer substrate that includes a light-emitting layer sequence, singulating the wafer substrate having the layer sequence into semiconductor components, applying the semiconductor components to an intermediate carrier, arranging a potting material on the intermediate carrier such that the potting material laterally surrounds the semiconductor components and is in direct contact, at least in places, with side surfaces of the semiconductor components, arranging one contact on one semiconductor component and the potting material, wherein one contact is arranged on a side of the semiconductor component and the potting material remote from the intermediate carrier, connecting the component to a carrier element, on a side of the semiconductor components remote from the intermediate carrier, removing the intermediate carrier and the wafer substrate of the semiconductor components, and bringing the semiconductor components into electrical contact by the contacts and the potting material.

18 Claims, 4 Drawing Sheets

(51) Int. Cl.
- *H01L 21/66* (2006.01)
- *H01L 25/075* (2006.01)
- *H01L 33/00* (2010.01)
- *H01L 33/54* (2010.01)
- *H01L 33/60* (2010.01)
- *H01L 33/32* (2010.01)

(52) U.S. Cl.
CPC ...... *H01L 25/0753* (2013.01); *H01L 33/0079* (2013.01); *H01L 33/54* (2013.01); *H01L 33/60* (2013.01); *H01L 33/32* (2013.01); *H01L 2221/68359* (2013.01); *H01L 2933/005* (2013.01); *H01L 2933/0066* (2013.01)

(58) Field of Classification Search
CPC ..... H01L 22/22; H01L 25/0753; H01L 33/32; H01L 2221/68359; H01L 2933/005; H01L 2933/0066; H01L 2933/0041; H01L 2933/0058; H01L 33/0095; H01L 33/486; H01L 33/50; H01L 33/502; H01L 33/505; H01L 33/56; H01L 33/58

See application file for complete search history.

(56) References Cited

U.S. PATENT DOCUMENTS

| | | | | |
|---|---|---|---|---|
| 9,466,581 | B2* | 10/2016 | Liu | H01L 24/13 |
| 9,484,508 | B2* | 11/2016 | Dirscherl | H01L 33/56 |
| 9,583,467 | B2* | 2/2017 | Illek | H01L 25/0753 |
| 9,698,282 | B2* | 7/2017 | Jaeger | H01L 23/49861 |
| 9,966,516 | B2* | 5/2018 | Schlosser | H01L 33/486 |
| 10,243,117 | B2* | 3/2019 | Herrmann | H01L 33/32 |
| 2008/0237828 | A1* | 10/2008 | Yang | H01L 21/6835 257/690 |
| 2009/0267108 | A1* | 10/2009 | Lin | H01L 24/24 257/99 |
| 2013/0207126 | A1* | 8/2013 | Ankireddi | G01S 17/026 257/81 |
| 2014/0034983 | A1* | 2/2014 | Gebuhr | H01L 33/54 257/98 |
| 2014/0231850 | A1 | 8/2014 | Tischler et al. | |
| 2015/0140711 | A1* | 5/2015 | Lei | H01L 33/0079 438/33 |
| 2016/0336717 | A1* | 11/2016 | Lin | H01S 5/02469 |
| 2018/0219146 | A1* | 8/2018 | Moosburger | H01L 33/486 |
| 2018/0309030 | A1* | 10/2018 | Herrmann | H01L 33/486 |

\* cited by examiner

METHOD OF PRODUCING AN OPTOELECTRONIC COMPONENT AND OPTOELECTRONIC COMPONENT

TECHNICAL FIELD

This disclosure relates to a method of producing an optoelectronic component and an optoelectronic component.

BACKGROUND

When a plurality of semiconductor chips are arranged in a light-emitting component, efforts are made to produce linear or planar LED components (in particular light engines) at low cost. It is thus advantageous to minimize the effort associated with testing and sorting the semiconductor chips. In current production methods, semiconductor chips are already configured with contacts prior to being mounted on carrier elements.

It could therefore be helpful to provide a method of producing an optoelectronic component and an optoelectronic component having improved contacting of a light-emitting semiconductor component.

SUMMARY

We provide a method of producing an optoelectronic component including providing a wafer substrate that includes a light-emitting layer sequence, singulating the wafer substrate having the layer sequence into a plurality of semiconductor components, applying the semiconductor components to an intermediate carrier, arranging a potting material on the intermediate carrier such that the potting material laterally surrounds the semiconductor components and is in direct contact, at least in places, with side surfaces of the semiconductor components, arranging in each case one contact on in each case one semiconductor component and the potting material, wherein in each case one contact is arranged on a side of the semiconductor component and of the potting material remote from the intermediate carrier, connecting the component to a carrier element, on a side of the semiconductor components remote from the intermediate carrier, removing the intermediate carrier and in each case the wafer substrate of the semiconductor components, and bringing the semiconductor components into electrical contact by way of the contacts and the potting material, wherein a contact layer leads to the light-emitting layer sequence over an upper side of the potting material remote from the contacts.

We also provide an optoelectronic component including a carrier element having contacts integrated therein, a plurality of semiconductor components each including a light-emitting layer sequence, wherein in each case one semiconductor component is provided on in each case one contact of the carrier element, a potting material provided on the carrier element and laterally surrounds the semiconductor components and is in direct contact, at least at in places, with side surfaces of the semiconductor components, a contact layer that leads, in each case over an upper side of the potting material remote from the carrier element, to one of the light-emitting layer sequences of the semiconductor components and makes electrical contact therewith, and a through-connection that makes electrical contact with a semiconductor component through the potting material, as a result of which the contact layer electrically conductively connects to a further contact of the carrier element.

LIST OF REFERENCE NUMERALS

1 Wafer substrate
1a Light-emitting layer sequence
3 Semiconductor component
3a Side of the semiconductor component
3b Side surface of the semiconductor component
4 Intermediate carrier
4a Upper side
4b Buffer layer
4c Detachable layer
5 Potting
5a Surface of the potting
6 Contact
6a Sacrificial layer
6b Surface of the sacrificial layer
6' Electrical contact point
7 Carrier element
7a Copper layer
7b Connection region
8 Contact layer
9 Through-connection
10 Optoelectronic component

DETAILED DESCRIPTION

Our method of producing an optoelectronic component includes providing a wafer substrate including a light-emitting layer sequence, singulating the wafer substrate having the layer sequence into a plurality of semiconductor components, and applying the semiconductor components to an intermediate carrier.

Advantageously, a wafer substrate includes a light-emitting layer sequence such that the light-emitting layer sequence is arranged on to the wafer substrate, advantageously being grown epitaxially. The light-emitting layer sequence advantageously has a constant thickness over the wafer substrate. By singulating the wafer substrate into a plurality of individual parts, individual semiconductor components result, each of which has a light-emitting layer sequence, preferably of the same thickness. The singulation is performed, for example, by plasma cutting. The singulated semiconductor components are arranged on an intermediate carrier, by which they can be held in a fixed location on the intermediate carrier for the purpose of further processing. The semiconductor components are advantageously each applied on the intermediate carrier from the wafer substrate side. In other words, once they have been arranged, the light-emitting layer sequence of each semiconductor component faces away from the intermediate carrier. The intermediate carrier includes, for example, FeNi.

Preferably, the semiconductor components are arranged at a lateral spacing from one another. In this case, the semiconductor components may be distributed on the intermediate carrier in any desired manner.

In a further step, the method includes arranging a potting on the intermediate carrier such that the potting laterally surrounds the semiconductor components and is in direct contact, at least in places, with side surfaces of the semiconductor components; and arranging in each case one contact on in each case one semiconductor component and the potting, wherein in each case a contact is arranged on a side of the semiconductor component and the potting remote from the intermediate carrier.

The potting is advantageously filled into the intermediate spaces between the semiconductor components. A suitable way of arranging the potting is, for example, film assisted transfer molding (FAM) or spin coating or dispensing the potting material, for example, of white Peterslack (Elpemer SD2491SG-TSW). In this case, the arrangement is effected such that a side of the semiconductor components remote from the intermediate carrier remains free of potting material.

The potting is preferably of reflective form and is, for example, white. The intermediate spaces between the semiconductor components advantageously form cavities into which the potting is introduced, wherein the height of the wafer substrate advantageously determines the depth of the cavities. Preferably, the wafer substrate is not thinned before the semiconductor components are provided on the intermediate carrier. This facilitates the application of the potting, for example, by film assisted transfer molding.

Advantageously, in each case one contact for each semiconductor component extends at least partly over a side of the semiconductor component remote from the intermediate carrier. Furthermore, the contact is arranged such that it extends beyond the semiconductor component onto the potting. For this purpose, when the potting is provided on the intermediate carrier, it is applied up to the same height as the semiconductor component such that the potting advantageously terminates flush with the semiconductor component and forms a planar surface with the side of the semiconductor component remote from the intermediate carrier. In this way, the contact can be guided from the semiconductor component onto the potting in a planar fashion, advantageously without the contact having a step or needing to overcome a difference in height.

The contacts are deposited onto the semiconductor components and the potting in a structured form, for example, by electroplating.

In a further step, the method includes connecting the component to a carrier element, on a side of the semiconductor components remote from the intermediate carrier, and removing the intermediate carrier and in each case the wafer substrate of the semiconductor components. Furthermore, the method includes electrically-contacting of the semiconductor components via the contacts and the potting, wherein a contact layer leads to the light-emitting layer sequence over an upper side of the potting remote from the contacts.

In the method, the semiconductor components, together with the potting and the contacts, are detached from the temporary intermediate carrier and applied to the carrier element, that remains in the component after the intermediate carrier has been detached. The semiconductor components may be in a strip-like or a planar arrangement. Advantageously, the contacts arranged on the semiconductor components are integrated into the carrier element, for example, being embedded therein and hence enclosed in a mechanically stable manner.

For the purpose of improving adhesion of the semiconductor components to the intermediate carrier, it is advantageously possible to arrange an adhesive layer on the intermediate carrier before the semiconductor components are provided. Furthermore, it is possible to provide a detachable layer on the intermediate carrier before the semiconductor components are arranged to facilitate removal of the intermediate carrier. The detachable layer may include Cr, for example. Furthermore, further layers, for example, buffer layers such as copper layers may be provided, for example, between the detachable layer and the adhesive layer. The adhesive layer, for example, succeeds the detachable layer in the direction away from the intermediate carrier. The adhesive layer may advantageously be formed by applying an adhesive material or an adhesive film.

The wafer substrate is detached by a detaching method, for example, an etching method such that advantageously only the light-emitting layer sequence of the semiconductor component remains and is advantageously exposed on a side remote from the carrier element.

The contact layer leads, over an upper side of the potting remote from the carrier element, to the light-emitting layer sequence and advantageously extends in part over an upper side thereof that is remote from the carrier element. The contact layer forms an electrical contact with the layer sequence, and the contact on the side of the layer sequence facing the carrier element forms another contact, the opposite pole to the contact layer.

In this way, linear and planar arrangements of light-emitting semiconductor components may advantageously be produced, wherein cost-effective processes from the technology of circuit board production can be used. For example, contact may be made by LDI (laser-assisted direct imprinting) or screen printing.

The semiconductor components can be implemented as thin film chips in the component.

The wafer substrate may include Si. A wafer substrate including Si is advantageously suitable to epitaxially grow semiconductor layers such as a light-emitting layer sequence. At the same time, a wafer substrate including Si is also suitable for being properly removed during the method such that the light-emitting layer sequence remains on the carrier element. In this case, the wafer substrate may be produced as a patterned silicon substrate (PSS).

The intermediate carrier may include Cu, FeNi or Co. As an alternative, the intermediate carrier may include a molding material. The intermediate carrier is a temporary carrier, that is to say a carrier that only temporarily remains in the component, for the production thereof. The intermediate carrier is formed from a solid material suitable to fasten the semiconductor components with mechanical stability and thereafter being removed from the semiconductor components again in a simple manner. The intermediate carrier may, for example, have a thickness of 70 µm to 100 µm.

A sacrificial layer may be provided laterally next to the semiconductor components on the intermediate carrier, at least in places, wherein the sacrificial layer is in direct contact, at least in places, with side surfaces of the semiconductor components and forms a concave surface between a side surface of the semiconductor component and the intermediate carrier.

The sacrificial layer advantageously rounds off an edge region between an upper side of the intermediate carrier and a side surface of one of the semiconductor components abutting against this upper side, for example, projecting perpendicularly therefrom. The thickness of the sacrificial layer above the upper side of the intermediate carrier and above the side surface of the semiconductor component advantageously becomes smaller as the distance from the edge region increases. The sacrificial layer may cover the upper side of the intermediate carrier and the side surface of the semiconductor component only partly or indeed entirely. The surface of the sacrificial layer in the edge region on the side remote from the intermediate carrier and the semiconductor component is thus advantageously concave in shape.

The potting may be applied on to the concavely curved surface of the sacrificial layer.

When the intermediate carrier and the wafer substrate are removed, the sacrificial layer may also be removed. The sacrificial layer advantageously prevents a potting arranged during the method from filling the edge region between the intermediate carrier and the semiconductor component, and prevents the potting from having a rectangular shape after the intermediate carrier has been removed.

After the intermediate carrier, the wafer substrate and the sacrificial layer have been removed, the potting may have a convex surface on a side remote from the carrier element.

The convex surface of the potting is produced in those regions that faced the edge regions between the intermediate carrier and the semiconductor components during the method. In the finished component, the convex surface of a reflective potting material results in a light-reflecting effect. Advantageously, a higher proportion of the light from the adjacent semiconductor component that incidents on the convex surface of the potting is deflected in the emitting direction of the component, i.e., away from the carrier element, than when the potting has a rectangular shape.

After the sacrificial layer has been removed, the contact layer may lead over the convex surface of the potting to the layer sequence.

By leading the contact over the convex surface, the light-emitting layer sequence can advantageously make contact with the contact layer at almost the same height, at its upper side that is remote from the carrier element. As a result, advantageously there is no need to overcome differences in height between an upper side of the potting and the layer sequence. Consequently, making contact between the layer sequence and the contact layer is simpler, preferably in a planar fashion.

The carrier element may include a plurality of layers.

The carrier element may advantageously include a plurality of layers, which may be heat conductors, copper layers, electrical conductors and so on. It is also possible to introduce through-connections into the carrier element. Suitable carrier elements are, for example, FR4 prepreg films (pre-impregnated fibers).

The component may connect to the carrier element by compression pressing.

Advantageously, the carrier element is subject to contact pressure at high temperature and pressure, which advantageously results in the contacts on the semiconductor components being at least partially embedded in the material of the carrier element and results in a mechanically stable bond between the contacts and the carrier element. Furthermore, advantageously, the contacts conductively connect to electrical conductors in the carrier element, in a process step during the compression pressing.

A through-connection may be formed in the potting for the purpose of making electrical contact with a semiconductor component, and the contact layer leads through this through-connection to one of the contacts.

The through-connection is formed in the potting, for example, by drilling, for example, using lasers, wherein the through-connection is only formed after the intermediate carrier has been removed. The through-connection is advantageously formed at a region of the potting located above a contact. This is a contact extending from the side of a semiconductor component facing the carrier element to a side of the potting facing the carrier element. In this way, an electrical connection leads from the contact to the upper side of the potting remote from the carrier element. The contact layer of a further semiconductor component advantageously adjoins the through-connection on the upper side. In this way, advantageously a semiconductor component can connect or interconnect by way of its contact leading to a contact of an adjacent semiconductor component by way of the through-connection in the potting. The adjacent semiconductor component may be brought into contact in a further region of the potting by a further through-connection.

The semiconductor components may connect in series. A plurality of semiconductor components may, for example, connect in series to adjacent semiconductor components, in each case via through-connections in the potting.

Functioning of the semiconductor components may be tested and, in the event of a defect, the contact layer of the defective semiconductor component is short-circuited.

In an arrangement of a plurality of semiconductor components, it is advantageous to short-circuit defective semiconductor components. Advantageously, individual semiconductor components are short-circuited such that the remaining semiconductor components can be contacted and remain in operation in the optoelectronic component. It is possible, for example, for a through-connection in the potting to be made wide enough for both contacts of two neighboring semiconductor components to make contact.

Short-circuiting of the contact layer may be performed by two through-connections through the potting to different contacts.

It is advantageously possible to make two through-connections in the potting between two adjacent semiconductor components, wherein the two through-connections electrically conductively connect to one another on a side of the potting remote from the contacts, and are thus short-circuited, for example, by the contact layer.

As an alternative thereto, it would also be possible to short-circuit the light-emitting layer sequence itself by destroying the p-n contact thereof, for example, by a laser, and making an electrically conductive connection.

The wafer substrate may be ground before being provided on the intermediate carrier, to a height of at most 40 μm, preferably 20 μm.

The height of the wafer substrate advantageously determines the height of the potting in the component. If the potting is designed to be reflective, it is thus advantageously possible to affect the emission characteristics of the component.

A mirror layer may be provided between one of the semiconductor components and the assigned contact. The light-emitting layer sequence of the semiconductor component is advantageously transparent and can emit light in all directions. To favor, for example, the upper side remote from the carrier element, a mirror layer is provided on the side of the semiconductor components, in particular the light-emitting layer sequence facing the carrier element and the contacts. The assigned contact may extend laterally beyond the mirror layer to encapsulate the mirror layer before the component connects to the carrier element. The mirror layer includes Ag, for example.

The optoelectronic component may include a carrier element having contacts integrated therein, and a plurality of semiconductor components each including a light-emitting layer sequence, wherein in each case one semiconductor component is provided on in each case one contact of the carrier element.

The optoelectronic component further includes a potting provided on the carrier element and laterally surrounds the semiconductor components and is in direct contact, at least in places, with side surfaces of the semiconductor components, and a contact layer that leads, in each case over an upper side of the potting remote from the carrier element, to one of the light-emitting layer sequences of the semiconductor components and makes electrical contact therewith.

The contacts advantageously extend from the light-emitting layer sequence onto the potting on a side of the potting facing the carrier element. It is furthermore possible for a mirror layer to be advantageously arranged between the light-emitting layer sequence and the contact to reflect light emitted from the layer sequence in a direction away from the carrier.

The potting between the semiconductor components may advantageously include a convex surface. By leading a contact over the convex surface, the light-emitting layer sequence is advantageously brought into contact with the contact layer at almost the same height, on its upper side remote from the carrier element. As a result, advantageously there is no need to overcome differences in height between an upper side of the potting and the layer sequence. Consequently, the layer sequence can make contact with the contact layer in a simple manner, preferably in a planar contact.

The optoelectronic component furthermore includes a through-connection to make electrical contact with a semiconductor component through the potting, as a result of which the contact layer electrically conductively connects to a further contact of the carrier element.

The through-connection of a semiconductor component is advantageously formed in a region of the potting located above a contact. This may be for each of the semiconductor components. This is a contact extending from the side of a semiconductor component facing the carrier element to a side of the potting facing the carrier element. In this way, an electrical connection leads from the contact to the upper side of the potting remote from the carrier element. The contact layer of a further semiconductor component advantageously adjoins the through-connection. In this way, advantageously, a semiconductor component can connect or interconnect by way of its contact leading to a contact of an adjacent semiconductor component by way of the through-connection in the potting. The adjacent semiconductor component may be contacted in a further region of the potting by a further through-connection. In this way, a plurality of semiconductor components may advantageously connect in series in the optoelectronic component.

Further advantages and developments will become apparent from the examples described below in conjunction with the figures.

Like or equivalent elements are each provided with the same reference characters throughout the figures. The components illustrated in the figures, and the relative dimensions of the components, should not be regarded as to be true to scale.

Figure 1:
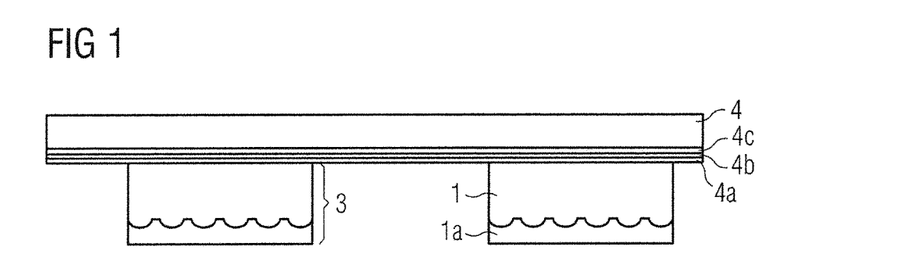
FIGS. 1, 2, 3, 4, 5 and 6 show an optoelectronic component in a schematic side view during the method.

FIG. 1 shows, in a schematic side view, an intermediate carrier 4 on which, in a method step, two semiconductor components 3 are arranged at a lateral spacing from one another. The semiconductor components 3 each include a wafer substrate 1 and a light-emitting layer sequence 1a, wherein, in the arrangement of the semiconductor components 3, the wafer substrate 1 faces the intermediate carrier. The intermediate carrier 4 includes, for example, Cu or is designed as a Cu foil. The wafer substrate 1 advantageously includes Si and has, for example, a height of 20 μm to 40 μm. The light-emitting layer sequence 1a includes a nitride compound semiconductor material such as GaN. Preferably, an n-doped GaN layer faces the wafer substrate 1.

It is furthermore possible for a mirror layer 11 to be advantageously arranged on a side of the light-emitting layer sequence 1a remote from the intermediate carrier 4. For this purpose, the semiconductor component is advantageously transparent to the light.

Furthermore, further layers are advantageously arranged on the intermediate carrier 1 before the semiconductor components 3 are provided. These may be an adhesive layer 4a, a buffer layer 4b and a detachable layer 4c provided between the intermediate carrier 4 and the semiconductor component 3, for example, in the above-mentioned order. The adhesive layer 4a serves to improve the adhesion of the semiconductor components 3 to the intermediate carrier. The adhesive layer 4a may advantageously be formed by applying an adhesive material or an adhesive film.

The detachable layer 4c makes it easier to subsequently remove the intermediate carrier 4 from the semiconductor component 3, in a subsequent method step. The detachable layer may, for example, include Cr.

Figure 2:
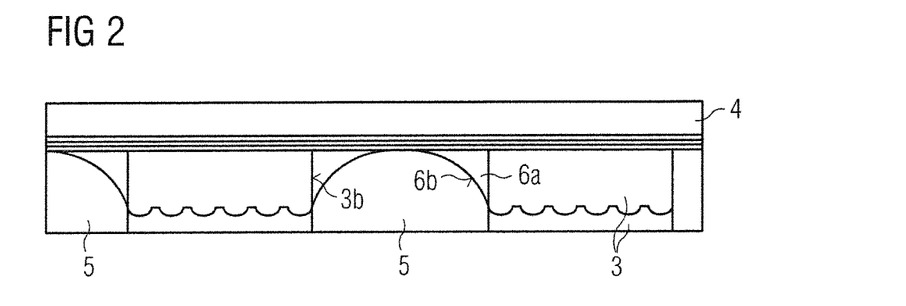

FIG. 2 shows, in a schematic side view, the intermediate carrier 4 of FIG. 1 wherein, in a further method step, a sacrificial layer 6a is arranged laterally next to the semiconductor components 3 on the intermediate carrier 4 such that the sacrificial layer 6a forms a concave surface 6b between a side surface 3b of the semiconductor component 3 and the intermediate carrier 4. Advantageously, the sacrificial layer rounds off an edge region between an upper side 4a of the intermediate carrier 4 and a side surface 3b of one of the semiconductor components, which abuts against this upper side 6b, for example, projecting perpendicularly therefrom. The thickness D of the sacrificial layer above the upper side 4a of the intermediate carrier 4 and above the side surface 3b of the semiconductor component 3 advantageously becomes smaller as the distance from the edge region increases. The sacrificial layer 6a, for example, covers the side surface 3b as far as an upper side of the layer sequence 1a remote from the intermediate carrier 4.

In a further method step, the potting 5 is applied to the concavely curved surface 6b of the sacrificial layer 6a. The potting 5 completely fills the intermediate spaces between the semiconductor components 3. In other words, the potting 5 terminates flush and planar with an upper side of the layer sequence 1a remote from the intermediate carrier 4. The potting is advantageously reflective and has a white appearance.

Figure 3:
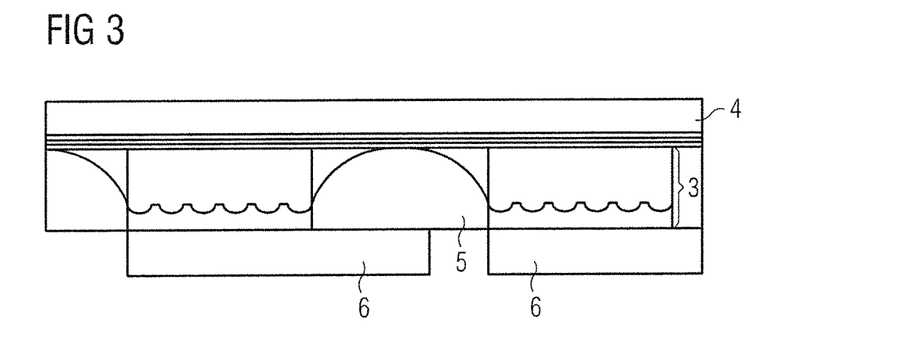

FIG. 3 shows, in a schematic side view, the intermediate carrier 4 from FIG. 1, wherein in a further method step contacts 6 are arranged on the semiconductor components 3. In each case, one contact 6 is assigned with in each case one semiconductor component 3 such that the contact 6 contacts the light-emitting layer sequence 1a at a side remote from the intermediate carrier 4, preferably over the entire width thereof. Furthermore, the contact is arranged such that it extends over the semiconductor component 3 and partly onto an upper side of the potting 5 remote from the intermediate carrier 4. The contacts 6 are provided on the semiconductor components 3 and the potting 5 in a structured form, for example, by electroplating, for example, by a mask and subsequent photolithography.

Figure 4:
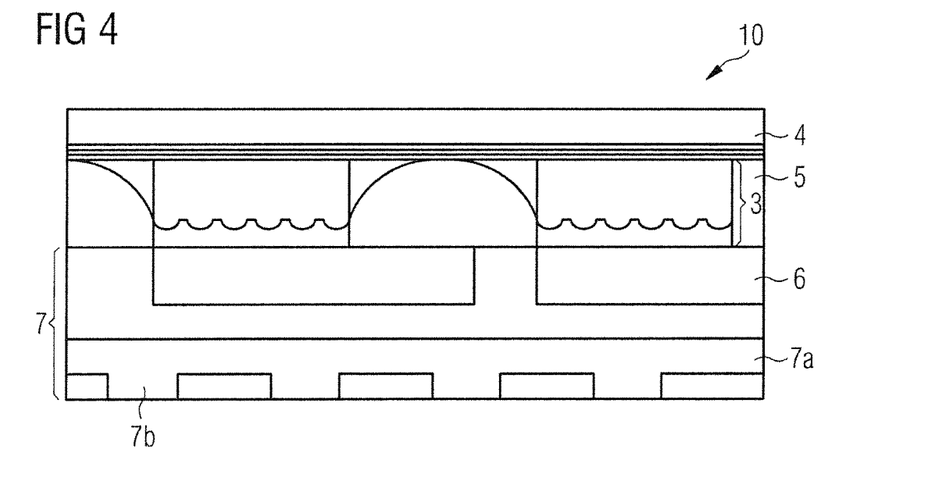

FIG. 4 shows, in a schematic side view, the intermediate carrier 4 of FIG. 1 wherein, in a further method step, a carrier element 7 connects to the component 10 such that the carrier element 7 is arranged on the side of the contacts 6 and the potting 5 remote from the intermediate carrier 4, by compression pressing. The contacts 6 are pressed into the carrier element 7 at high temperature and pressure such that the contacts 6 are embedded within the material of the carrier element 7. After the compression pressing, the carrier element 7 is in direct contact with the potting and the contacts 6. The carrier element 7 advantageously includes a plurality of layers. For example, the carrier element 7 includes an FR4 prepreg film (pre-impregnated fibers). The carrier element 7 may include heat conductors and/or electrical conductors, for example, copper layers. In FIG. 4, the carrier element 7 includes a further copper layer 7a for improved dissipation of heat from the semiconductor components 3. The copper layer 7a advantageously extends within the interior of the carrier element 7 and has connection regions 7b to an outer surface of the carrier element 7 remote from the semiconductor components 3.

Figure 5:
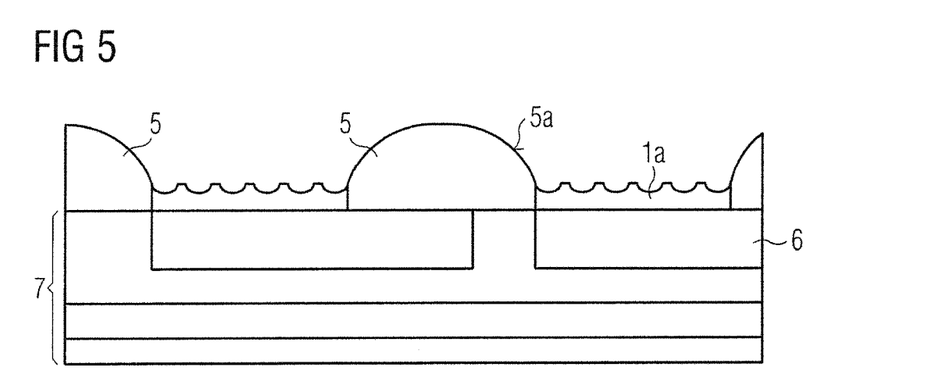

FIG. 5 shows, in a schematic side view, the component 10 from FIG. 4 wherein, in a further method step, the intermediate carrier 4, the sacrificial layer 6 and the wafer substrate 1 have been removed. After the sacrificial layer has been removed, regions of the potting 5 having an upper side 5a with a convex surface remote from the carrier element 7 remain between the light-emitting layer sequences 1a of the semiconductor components 3.

The convex surface of the potting is produced in the regions that faced the edge regions between the intermediate carrier and the semiconductor components during the method. The convex surface of a reflective potting 5 gives a light-reflecting effect. Advantageously, a higher proportion of light from the abutting light-emitting layer sequence 1a that incidents on the convex surface 5a of the potting 5 is deflected in the emitting direction of the component, that is to say away from the carrier element 7, than when the potting has a rectangular shape.

Figure 6:
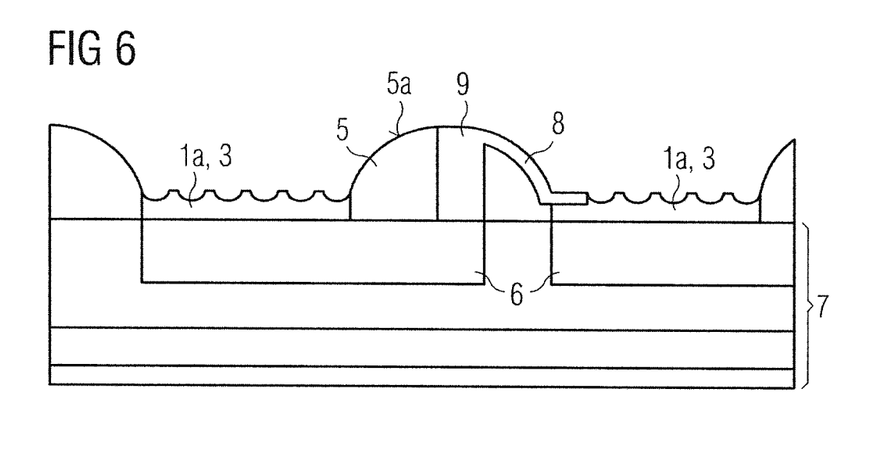

FIG. 6 shows, in a schematic side view, the component 10 from FIG. 5 wherein, in a further method step, a through-connection 9 is formed in the potting 5, and a contact layer 8 leads from this through-connection 9 over the convex surface 5a of the potting 5 to the light-emitting layer sequence 1a. The light-emitting layer sequence 1a advantageously contacts in a planar fashion the contact layer 8 at its upper side remote from the carrier element 7. As a result, advantageously, there is no need to overcome differences in height between an upper side of the potting and the layer sequence. Consequently, contact between the layer sequence and the contact layer is simpler, preferably in planar contacting.

The through-connection is formed, for example, by drilling into the potting, for example, using a laser. Advantageously, the through-connection 9 is formed at a region of the potting located above a contact 6. This is a contact 6 extending from the side of a semiconductor component 3 facing the carrier element 7 to a side of the potting 5 facing the carrier element. In this way, an electrical connection leads from the contact 6 to the upper side 5a of the potting 5 remote from the carrier element 7. The contact layer 8 of a further adjacent semiconductor component 3 advantageously adjoins the through-connection 9 on the upper side 5a. In this way, advantageously a semiconductor component 3 can be connected or wired up by way of its contact layer 8 to a contact 6 of an adjacent semiconductor component 3 by way of the through-connection 9 in the potting 5.

Figure 7:
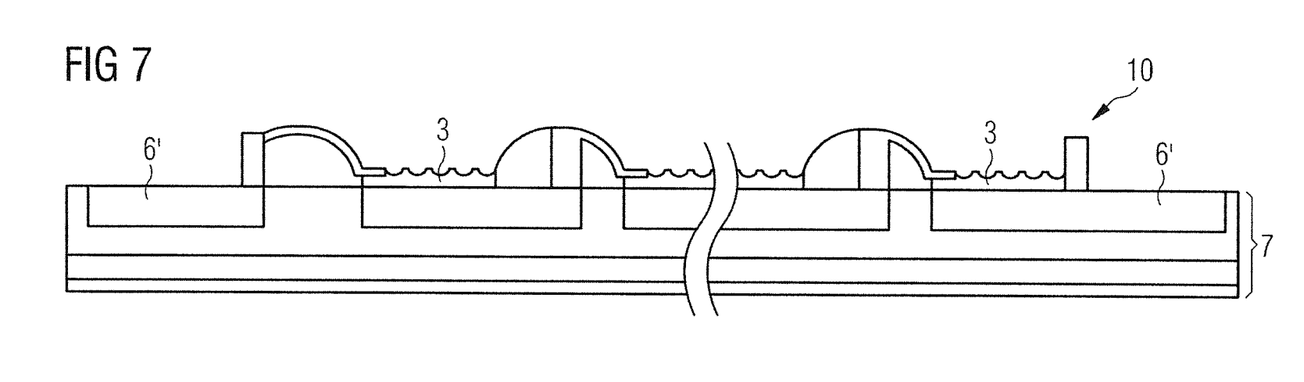
FIG. 7 shows a completed optoelectronic component in a schematic side view.

FIG. 7 shows, in a schematic side view, the finished component 10 from FIG. 6 after completion of the method. A plurality of semiconductor components 3 is provided on a carrier element 7 and connected in series. The outermost contacts 6, on the outside left and on the outside right, form the electrical contact points 6' by way of which the component 10 can be contacted from the outside.

Figure 8A:
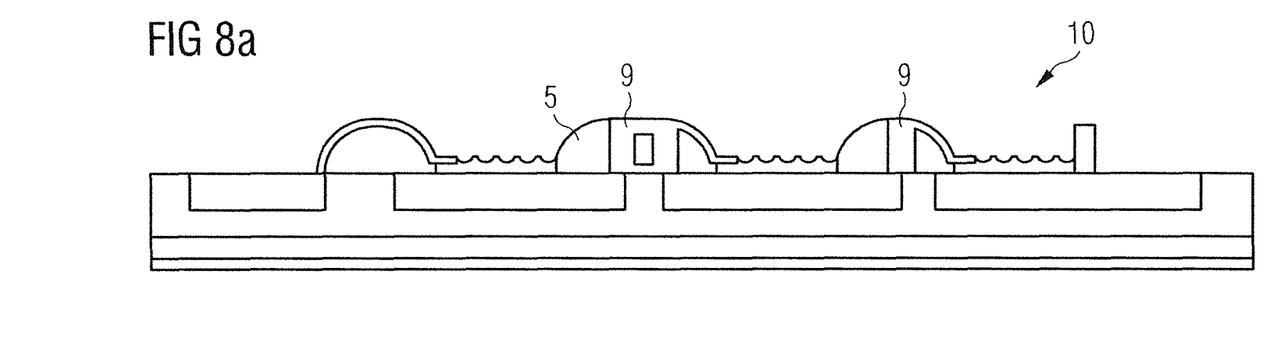
FIGS. 8a and 8b show short-circuiting of the contacts.
Figure 8B:
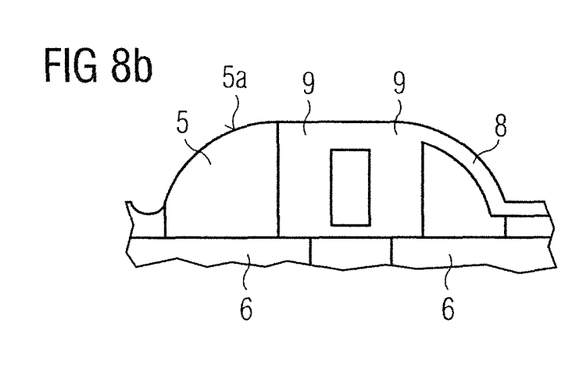

FIGS. 8a and 8b show designs of the through-connections 9 in the component 10 for the case in which a defective semiconductor component 3 has to be short-circuited.

Functioning of the semiconductor components 3 can be tested in the component 10, and in the event of a defect they can be short-circuited. Individual semiconductor components 3 can advantageously be short-circuited such that the remaining semiconductor components 3 can still make contact and remain in operation in the optoelectronic component 10.

FIG. 8a shows a component 10 in which, for the purpose of short-circuiting, a through-connection 9 is made wide enough for both contacts 6 of two adjacent semiconductor components to make contact.

FIG. 8b shows a further way of short-circuiting, wherein two through-connections 9 lead through the potting 5 to different contacts 6 and connected to one another at the upper side 5a of the potting 5 by the contact layer 8.

As an alternative thereto, it would also be possible to short-circuit the light-emitting layer sequence 1a itself by destroying the pn contact thereof, for example, by a laser, and connecting it electrically conductively.

The description given by way of the examples does not limit our methods and components thereto. Rather, this disclosure includes any new feature and any combination of features, including in particular any combination of features in the appended claims, even if the feature or combination is not itself explicitly specified in the claims or examples.

This application claims priority of DE 10 2015 107 742.6, the subject matter of which is incorporated herein by reference.

The invention claimed is:

1. A method of producing an optoelectronic component comprising:
    providing a wafer substrate that includes a light-emitting layer sequence,
    singulating the wafer substrate having the layer sequence into a plurality of semiconductor components,
    applying the semiconductor components to an intermediate carrier,
    arranging a potting material on the intermediate carrier such that the potting material laterally surrounds the semiconductor components and is in direct contact, at least in places, with side surfaces of the semiconductor components,
    arranging in each case one contact on in each case one semiconductor component and the potting material, wherein in each case one contact is arranged on a side of the semiconductor component and of the potting material remote from the intermediate carrier,
    connecting the component to a carrier element, on a side of the semiconductor components remote from the intermediate carrier,
    removing the intermediate carrier and in each case the wafer substrate of the semiconductor components, and
    bringing the semiconductor components into electrical contact by way of the contacts and the potting material, wherein a contact layer leads to the light-emitting layer sequence over an upper side of the potting material remote from the contacts.

2. The method according to claim 1, wherein the wafer substrate includes Si.

3. The method according to claim 1, wherein the intermediate carrier includes Cu, PeNi or Co.

4. The method according to claim 1, wherein a sacrificial layer is arranged laterally next to the semiconductor components on the intermediate carrier, at least in places, and the sacrificial layer is in direct contact, at least in places, with side surfaces of the semiconductor components and forms a concave surface between a side surface of the semiconductor component and the intermediate carrier.

5. The method according to claim 4, wherein the potting material is applied to the concavely curved surface of the sacrificial layer.

6. The method according to claim 4, wherein, when the intermediate carrier and the wafer substrate are removed, the sacrificial layer is also removed.

7. The method according to claim 6, wherein, after the intermediate carrier, the wafer substrate and the sacrificial layer have been removed, the potting material has a convex surface on a side remote from the carrier element.

8. The method according to claim 4, wherein, after the sacrificial layer has been removed, the contact layer leads over the convex surface of the potting material to the layer sequence.

9. The method according to claim 1, wherein the carrier element includes a plurality of layers.

10. The method according to claim 1, wherein the component connects to the carrier element by compression pressing.

11. The method according to claim 1, wherein a through-connection is formed in the potting material to electrically-contact a semiconductor component, and the contact layer leads through this through-connection to one of the contacts.

12. The method according to claim 1, wherein the semiconductor components connect in series.

13. The method according to claim 1, wherein functioning of the semiconductor components is tested, and in the event of a defect the contact layer of the defective semiconductor component is short-circuited.

14. The method according to claim 1, wherein the short-circuiting of the contact layer is performed by two through-connections through the potting material to different contacts.

15. The method according to claim 1, wherein the wafer substrate is ground before being provided on the intermediate carrier, to a height of at most 40 µm.

16. The method according to claim 1, wherein a mirror layer is provided between one of the semiconductor components and the assigned contact.

17. An optoelectronic component comprising:
a carrier element having contacts integrated therein,
a plurality of semiconductor components each including a light-emitting layer sequence, wherein in each case one semiconductor component is provided on in each case one contact of the carrier element,
a potting material provided on the carrier element that laterally surrounds the semiconductor components, is in direct contact, at least at in places, with side surfaces of the semiconductor components, and has a convex side remote from the carrier element,
a contact layer that leads, in each case over an upper side of the potting material remote from the carrier element, to one of the light-emitting layer sequences of the semiconductor components and makes electrical contact therewith, and
a through-connection that makes electrical contact with a semiconductor component through the potting material, as a result of which the contact layer electrically conductively connects to a further contact of the carrier element.

18. The optoelectronic component according to claim 17, wherein the light-emitting layer sequence contacts in a planar fashion the contact layer at its upper side remote from the carrier element such that there is no need to overcome differences in height between an upper side of the potting material and the layer sequence.

* * * * *